(12) United States Patent
Choi et al.

(10) Patent No.: US 10,707,820 B2
(45) Date of Patent: Jul. 7, 2020

(54) POWER AMPLIFYING APPARATUS WITH ASYMMETRICAL AMPLIFICATION STRUCTURE AND LINEARITY

(71) Applicant: SAMSUNG ELECTRO-MECHANICS CO., LTD., Suwon-si (KR)

(72) Inventors: Kyu Jin Choi, Suwon-si (KR); Jae Hyouck Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 3 days.

(21) Appl. No.: 16/161,236

(22) Filed: Oct. 16, 2018

(65) Prior Publication Data

US 2019/0199301 A1 Jun. 27, 2019

(30) Foreign Application Priority Data

Dec. 27, 2017 (KR) .......................... 10-2017-0181053

(51) Int. Cl.
*H03F 3/38* (2006.01)
*H03F 3/21* (2006.01)
(Continued)

(52) U.S. Cl.
CPC ............ *H03F 3/211* (2013.01); *H03F 1/0211* (2013.01); *H03F 1/0261* (2013.01);
(Continued)

(58) Field of Classification Search
CPC ................................. H03F 1/07; H03F 1/0288
(Continued)

(56) References Cited

U.S. PATENT DOCUMENTS 6,791,418 B2 * 9/2004 Luo ........................ H03F 1/0266
330/136
6,937,094 B2 * 8/2005 Khanifar ............... H03F 1/0244
330/129

(Continued)

FOREIGN PATENT DOCUMENTS

KR 10-1002893 B1 12/2010

OTHER PUBLICATIONS

Baek, Seugjun, et al., "A Linear InGaP/GaAs HBT Power Amplifier Using Parallel-Combined Transistors With IMD3 Cancellation", *IEEE Microwave and Wireless Components Letters*, Nov. 2016, vol. 26, No. 11, pp. 921-923 (3 pages in English).

*Primary Examiner* — Henry Choe
(74) *Attorney, Agent, or Firm* — NSIP Law (57) ABSTRACT

A power amplifying apparatus includes a first bias circuit that generates a first bias current having a first magnitude, a first amplification circuit connected between a first node and a second node, and that receives the first bias current, amplifies a signal input through the first node, and outputs a first amplified signal to the second node, a second bias circuit that generates a second bias current having a second magnitude that is different from the first magnitude of the first bias current, and a second amplification circuit connected in parallel with the first amplification circuit between the first node and the second node, and that receives the second bias current, amplifies the signal input through the first node, and outputs a second amplified signal to the second node, wherein the second amplification circuit may have a size that is different from a size of the first amplification circuit.

16 Claims, 5 Drawing Sheets

(51) Int. Cl.
*H03G 3/30* (2006.01)
*H03F 1/02* (2006.01)
*H03F 1/32* (2006.01)

(52) U.S. Cl.
CPC ......... *H03F 1/3223* (2013.01); *H03G 3/3042* (2013.01); *H03F 2200/451* (2013.01)

(58) Field of Classification Search
USPC .............................................. 330/124 R, 295
See application file for complete search history.

(56) References Cited

U.S. PATENT DOCUMENTS

| | | | |
|---|---|---|---|
| 7,936,213 B2* | 5/2011 | Shin | H03F 1/0288 330/124 R |
| 2007/0032208 A1 | 2/2007 | Choi et al. | |
| 2008/0036541 A1* | 2/2008 | Thompson | H03F 1/30 330/295 |

* cited by examiner

POWER AMPLIFYING APPARATUS WITH ASYMMETRICAL AMPLIFICATION STRUCTURE AND LINEARITY

CROSS-REFERENCE TO RELATED APPLICATION

This application claims the benefit under 35 U.S.C. § 119(a) of Korean Patent Application No. 10-2017-0181053 filed on Dec. 27, 2017 in the Korean Intellectual Property Office, the entire disclosure of which is incorporated herein by reference for all purposes.

BACKGROUND

1. Field

This application relates to a power amplifying apparatus that maintains linearity with an asymmetrical amplification structure.

2. Description of Related Art

As the demand for broadband, multimedia and intelligence capabilities in wireless communications systems gradually increases, demand for broadband capability, improvements in linearity, and intelligence capabilities in radio frequency (RF) power amplifiers applied to wireless communications systems may also increase.

Since it is beneficial for the RF power amplifier to operate linearly in a higher power region, linearity should be ensured for a wideband signal that includes a plurality of frequency bands without distortion.

In the typical RF power amplifier, however, when an interval between fundamental frequency signals of two or more different bands is narrow, since the fundamental frequency signal is adjacent to a third-order intermodulation distortion (hereinafter, referred to as IM3) component, a difference (hereinafter, referred to as IMD3) between the IM3 component and the fundamental frequency signal, and linearity are decreased.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power amplifying apparatus includes a first bias circuit configured to generate a first bias current which has a first magnitude, a first amplification circuit connected between a first node and a second node, and configured to receive the first bias current, amplify a signal input through the first node, and output a first amplified signal to the second node, a second bias circuit configured to generate a second bias current which has a second magnitude that is different from the first magnitude of the first bias current, and a second amplification circuit connected in parallel with the first amplification circuit between the first node and the second node, and configured to receive the second bias current, amplify the signal input through the first node, and output a second amplified signal to the second node, wherein the second amplification circuit may have a current gain that is different from a current gain of the first amplification circuit.

The second amplified signal may have a third-harmonic component having a phase that offsets from a third-order intermodulation distortion (IM3) component in the first amplified signal.

The magnitude of the second bias current may be less than the magnitude of the first bias current.

A number of transistors in the second amplification circuit may be greater than a number of transistors in the first amplification circuit.

The current gain of the second amplification circuit may be greater than the current gain of the first amplification circuit.

The magnitude of the second bias current may be greater than the magnitude of the first bias current.

A number of transistors in the second amplification circuit may be smaller than a number of transistors in the first amplification circuit.

The current gain of the second amplification circuit may be less than the current gain of the first amplification circuit.

The first bias current may be a bias current of class AB, and the second bias current may be a bias current of deep class AB between class AB and class B.

The second bias circuit may be configured to generate the second bias current to have a magnitude that corresponds to a magnitude of a fundamental frequency included in the input signal.

In a general aspect, a power amplifying apparatus includes a drive bias circuit configured to generate a drive bias current, a drive amplification circuit connected between an input terminal and a first node, and configured to receive the drive bias current amplify an input signal which has a first frequency component and a second frequency component, and output a first amplified signal, a first bias circuit configured to generate a first bias current which has a first magnitude, a first amplification circuit connected between the first node and a second node, and configured to receive the first bias current, amplify a signal input through the first node, and output a second amplified signal to the second node, a second bias circuit configured to generate a second bias current which has a second magnitude different from the first magnitude of the first bias current, and a second amplification circuit connected in parallel with the first amplification circuit between the first node and the second node, and configured to receive the second bias current, amplify the signal input through the first node, and output a third amplified signal to the second node, wherein the second amplification circuit is configured to have a current gain that is different from a current gain of the first amplification circuit.

The third amplified signal may have a third-harmonic component having a phase that offsets from a third-order intermodulation distortion (IM3) component in the second amplified signal.

The magnitude of the second bias current may be less than the magnitude of the first bias current.

The current gain of the second amplification circuit may be higher than the current gain of the first amplification circuit.

The magnitude of the second bias current may be greater than the magnitude of the first bias current.

The current gain of the second amplification circuit may be lower than the current gain of the first amplification circuit.

The first bias current may be a bias current of class AB, and the second bias current may be a bias current of deep class AB between class AB and class B.

The second bias circuit may be configured to generate the second bias current to have a magnitude that corresponds to a magnitude of a fundamental frequency included in the input signal.

In a general aspect, a power amplifying apparatus includes a first amplifier of a first current gain, and configured to generate a first amplified signal based on a received first bias current and an input signal comprising one or more frequency components, and a second amplifier of a second current gain greater than the first current gain, connected in parallel with the first amplifier, and configured to generate a second amplified signal based on a received second bias current and the input signal, wherein the second amplified signal may have a third-harmonic component having a phase that offsets from a third-order intermodulation distortion (IM3) component in the first amplified signal.

A number of transistors of the second amplifier may be greater than a number of transistors of the first amplifier.

Other features and aspects will be apparent from the following detailed description, the drawings, and the claims.

Throughout the drawings and the detailed description, the same reference numerals refer to the same elements. The drawings may not be to scale, and the relative size, proportions, and depiction of elements in the drawings may be exaggerated for clarity, illustration, and convenience. In the drawings, for example, due to manufacturing techniques and/or tolerances, modifications of the shape shown may be estimated. Thus, the examples described herein should not be construed as being limited to the particular shapes of regions shown herein, for example, the examples described herein include a change in shape as a result of manufacturing.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Figure 1:
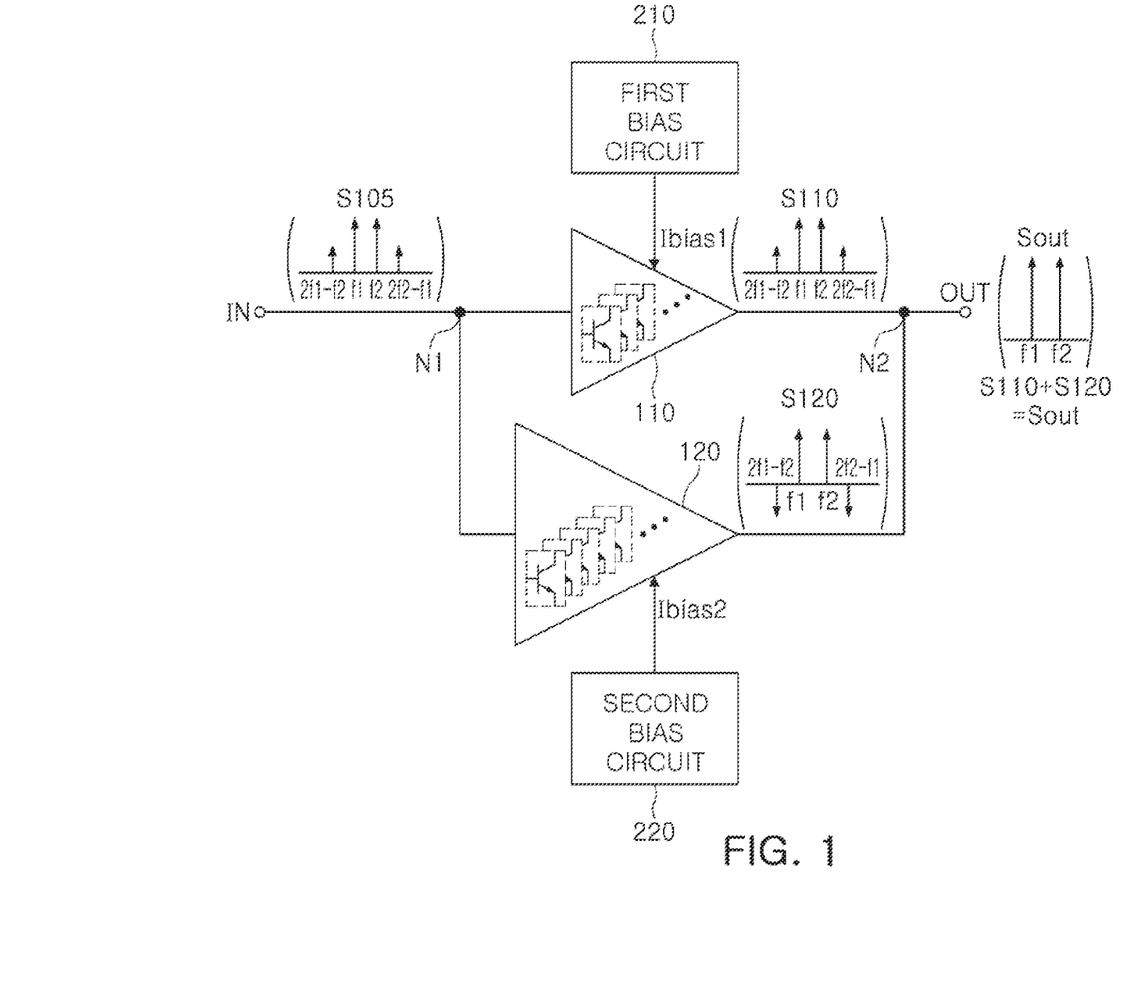
FIG. 1 is a view illustrating an example of a configuration of a power amplifying apparatus.

FIG. 1 is a view illustrating an example of a configuration of a power amplifying apparatus.

Referring to FIG. 1, a power amplifying apparatus according to an example may include a first bias circuit 210, a first amplification circuit (or amplifier) 110, a second bias circuit 220, and a second amplification circuit (or amplifier) 120.

Figure 2:
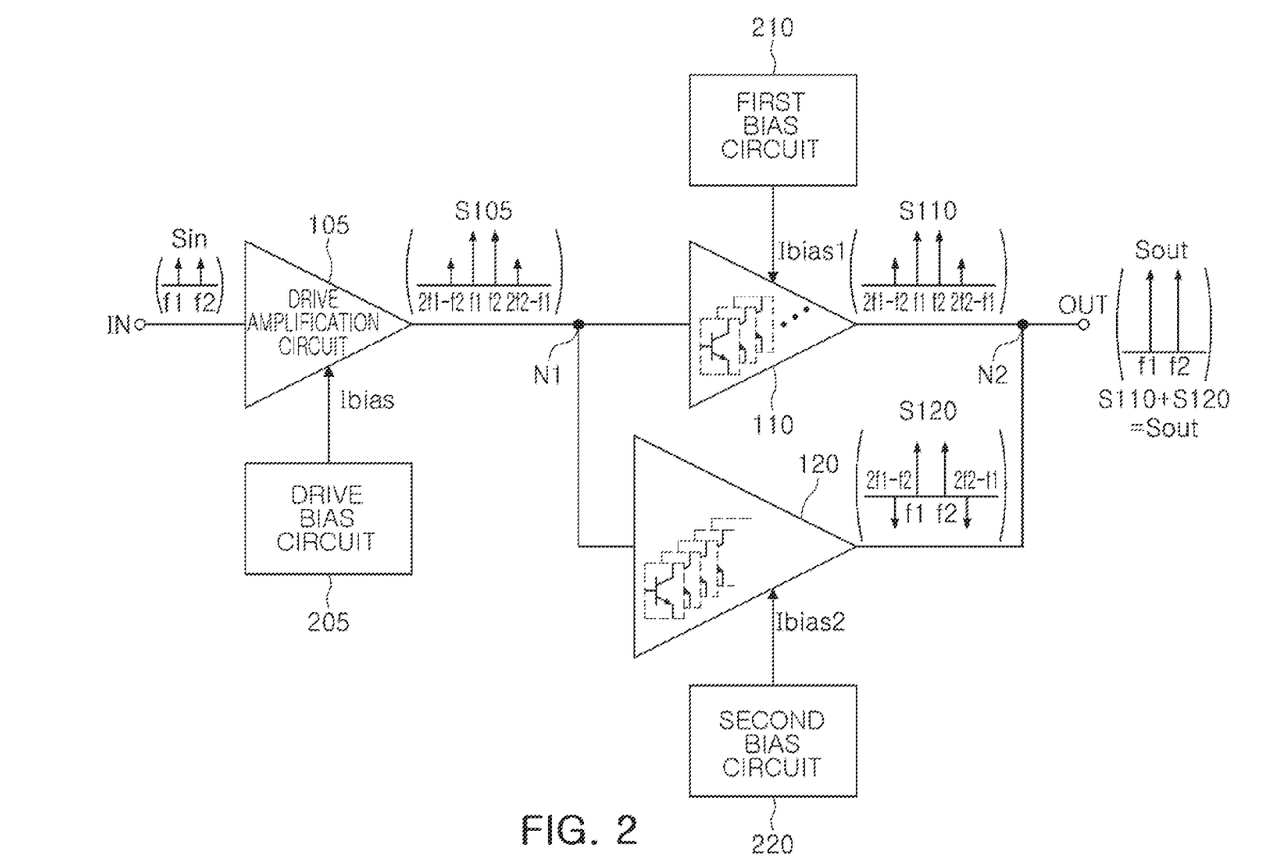
FIG. 2 is a view illustrating an example of a configuration of a power amplifying apparatus.

FIG. 2 is a view illustrating another example of a configuration of a power amplifying apparatus. Referring to FIG. 2, the power amplifying apparatus may include a drive bias circuit 205, a drive amplification circuit 105, the first bias circuit 210, the first amplification circuit 110, the second bias circuit 220, and the second amplification circuit 120.

Referring to FIG. 2, the drive bias circuit 205 may generate a drive bias current Ibias.

The drive amplification circuit 105 may be supplied with the drive bias current Ibias and amplify an input signal Sin of two tones having a first frequency component f1 and a second frequency component f2, and output an amplified signal S105. As an example, the amplified signal S105 may include an IM3 component (2f1-f2, 2f2-f1) other than the amplified first frequency component f1 and the amplified second frequency component f2.

As an example, the first frequency component f1 and the second frequency component f2 may be Long Term Evolution (LTE) B1 high channel (fc:1979.5 MHz) two tone signal, and in this case, a tone spacing may be 1 MHz.

Referring to FIGS. 1 and 2, the first bias circuit 210 may generate a first bias current Ibias1.

The first amplification circuit 110 may be supplied with the first bias current Ibias1 and amplify a signal which is input through a first node N1 (or an input terminal IN, FIG. 1), which is an output node of the drive amplification circuit 105, and output a first amplified signal S110 to a second node N2. As an example, the first amplified signal S110 may include the amplified first frequency component f1, the amplified second frequency component f2, and an IM3 component (2f1-f2, 2f2-f1).

The second bias circuit 220 may generate a second bias current Ibias2 having a magnitude different from a magnitude of the first bias current Ibias1. As an example, the second bias current Ibias2 may have magnitude smaller than a magnitude of the first bias current Ibias1. As another example, the second bias current Ibias2 may have magnitude greater than a magnitude of the first bias current Ibias1.

For example, the first bias current Ibias1 may be a bias current of class AB, and the second bias current Ibias2 may be a bias current of deep class AB between class AB and class B.

The second amplification circuit 120 may be connected in parallel with the first amplification circuit 110 and may be supplied with the second bias current Ibias2. The second amplification circuit 120 may amplify a signal which is input through a first node N1 (or an input terminal IN, FIG. 1) and output a second amplified signal S120 to the second node N2. As an example, in order to accurately cancel the IM3 component, the second amplification circuit 120 may have a size different from a size of the first amplification circuit 110. In an example, the size may be a physical size of the amplification circuits 110 and 120. As another example, the second amplification circuit 120 may have a current gain different from a current gain of the first amplification circuit 110.

As an example, the second amplified signal S120 may include the amplified first frequency component f1 and the amplified second frequency component f2, and may also include an IM3 component (2f1-f2, 2f2-f1) in which a phase is shifted.

In addition, the second amplification circuit 120 may output the second amplified signal S120 with a third-harmonic component that has a phase that may offset or cancel the IM3 component included in the first amplified signal S110, based on the second bias current Ibias2. As an example, the shifted phase, or the phase that may offset or cancel the IM3 component, may be a phase between 150° and 180°, and may be substantially 180° to increase a cancellation effect of the IM3 component.

Additionally, the second amplification circuit 120 may be implemented in a size different from a size of the first amplification circuit 110 and may output the second amplified signal S120 with a third-harmonic component of the same magnitude as the magnitude of the IM3 component included in the first amplified signal S110.

Accordingly, in the second node N2, since the first frequency component f1 and the second frequency component f2 from the first amplification circuit 110 have the same phase as that of the first frequency component f1 and the second frequency component f2 from the second amplification circuit 120, the first frequency component f1 and the second frequency component f2 from the first amplification circuit 110, and the first frequency component f1 and the second frequency component f2 from the second amplification circuit 120 are added to each other, such that the magnitude of the first frequency component f1 and the second frequency component f2 may be further increased.

On the other hand, in the second node N2, the IM3 component (2f1-f2, 2f2-f1) from the first amplification circuit 110 has a shifted phase of approximately 180° with the IM3 component (2f2-f2, 2f2-f1) from the second amplification circuit 120 and the magnitudes thereof are approximately the same as each other, such that the IM3 component (2f1-f2, 2f2-f 1) from the first amplification circuit 110 and the IM3 component (2f1-f2, 2f2-f1) from the second amplification circuit 120 are offset from each other. As a result, in the second node N2, the magnitude of the IM3 component (2f1-f2, 2f2-f1) may be significantly reduced or the IM3 component may be almost canceled.

As described above, when a first amplification circuit 110 and a second amplification circuit 120 driven at different bias levels have a specific bias magnitude difference, the IM3 components generated at the respective outputs may have a phase difference of 180°, and since the first amplification circuit 110 and the second amplification circuit 120 may be implemented in different sizes, and the magnitudes of the output IM3 components may be the same as each other, the IM3 component may almost be canceled.

According to the example, when the respective IM3 components generated from the first amplification circuit 110 and the second amplification circuit 120 have approximately the same magnitude as each other and have a phase difference of 180°, a maximum cancellation effect may be achieved.

In an example, in a case in which the magnitudes of the respective biases of the first amplification circuit 110 and the second amplification circuit 120 are different from each other, a concept in which the phases of the IM3 components output from the first amplification circuit 110 and the second amplification circuit 120 are shifted will be described. The reason is that in each amplification circuit, a third-order transconductance gm" of a transistor associated with the IM3 may have a negative value or a positive value depending on a bias level. For example, when the transistor of the amplification circuit is biased, the third-order transconductance may have a positive value +gm" in a case in which the transistor is in a weak inversion region, and the third-order transconductance may have a negative value −gm" in a case in which the transistor is in a strong inversion region. On the other hand, a first-order transconductance associated with a fundamental frequency signal may always have the positive value regardless of the biased region.

As described above, the first and second amplification circuits 110 and 120, which are biased to have different magnitudes so that the phase difference of the IM3 components is 180°, may have a current magnitude of the IM3 components determined based on a relative size of the first and second amplification circuits 110 and 120 as described above. The relative size of the first and second amplification circuits 110 and 120 may be important to achieve a more efficient IM3 cancellation effect.

In the respective examples, the first and second amplification circuits 110 and 120 may be asymmetrically connected in parallel with each other, and may be biased to different levels, so that the most efficient IM3 cancellation effect may be obtained. Additionally, the second amplification circuit 120 may have a size that is different from a size of the first amplification circuit 110. As an example, the size of the first amplification circuit 110 or the second amplification circuit 120 may correspond to the number of transistors which are connected in parallel to each other, but is not limited thereto. As another example, the second amplification circuit 120 may have a current gain different from a current gain of the first amplification circuit 110. As an example, a gain of the first amplification circuit 110 or the second amplification circuit 120 may be determined by the number of transistors which are connected in parallel to each other, but is not limited thereto.

In the respective drawings of the present disclosure, unnecessarily overlapped descriptions are possibly omitted for components having the same reference numeral and the same function, and differences in the respective drawings will be described.

Figure 3:
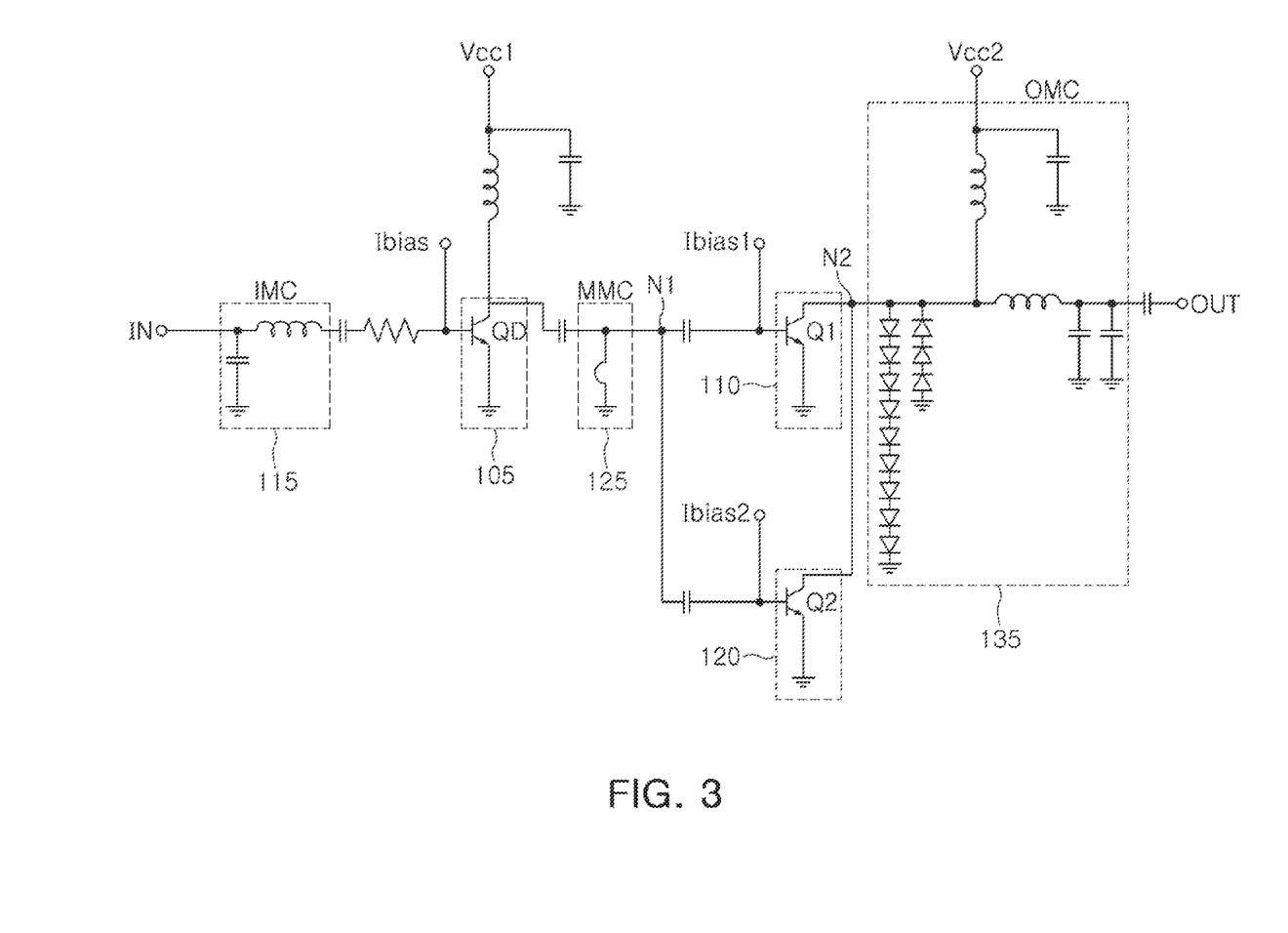
FIG. 3 is a view illustrating an example of an implementation of a power amplification circuit.

FIG. 3 is a view illustrating an example of an implementation of a power amplifying apparatus.

Referring to FIG. 3, the drive amplification circuit 105 may include a plurality of drive transistors QD having a base to which a drive bias current Ibias is supplied. The first amplification circuit 110 may include a plurality of first amplification transistors Q1 having a base to which a first bias current Ibias1 is supplied. The second amplification circuit 120 may include a plurality of second amplification transistors Q2 having a base to which a second bias current Ibias2 is supplied.

In addition, the power amplification circuit may include an input matching circuit (IMC) 115, an inter-stage matching circuit (MMC) 125, and an output matching circuit (OMC) 135.

The input matching circuit IMC 115 may include an inductor and a capacitor.

The inter-stage matching circuit MMC 125 may include a wire inductor.

The output matching circuit OMC 135 may include an inductor, a capacitor, and a diode circuit for discharge protection which is reversely connected.

As an example, a DC blocking capacitor may be connected between the above-mentioned circuits.

As an example, each of the drive transistor QD, the first amplification transistor Q1, and the second amplification transistor Q2 may be a hetero-junction bipolar transistor (HBT), but is not limited thereto.

Figure 4:
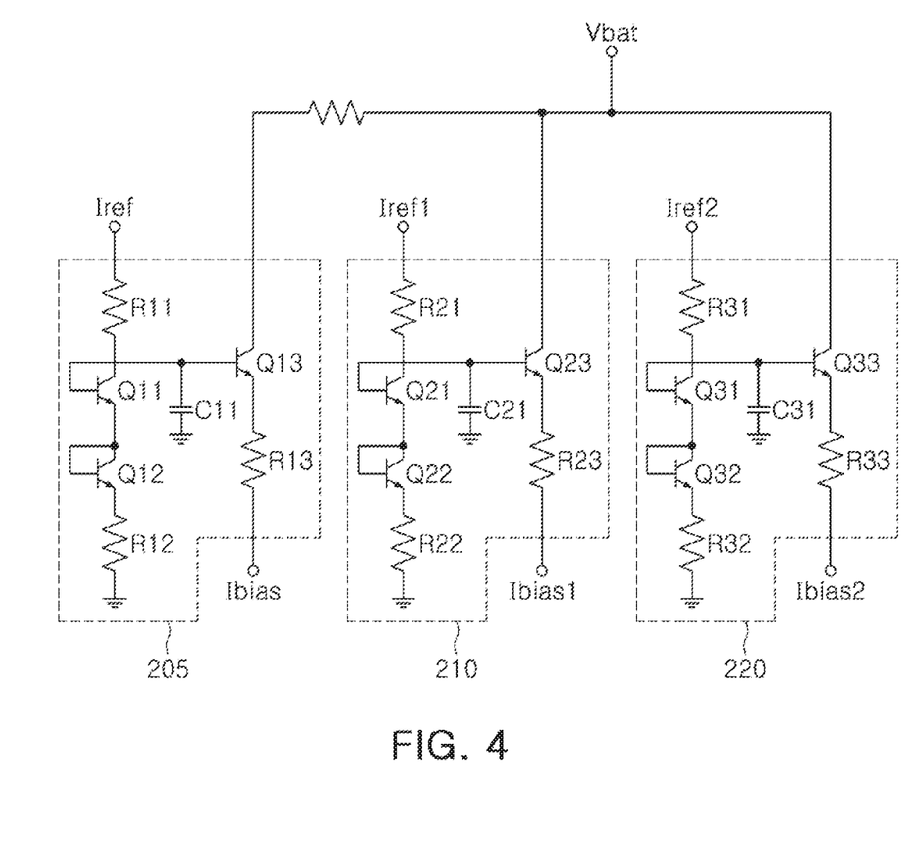
FIG. 4 is a view illustrating an example of an implementation of a bias circuit.

FIG. 4 is a view illustrating an example of a bias circuit.

Referring to FIG. 4, as an example, the drive bias circuit 205 may include a resistor R11, transistors Q11 and Q12 connected to each other by a diode, and a resistor R12, which are connected to each other in series between a drive reference current Iref terminal and a ground. The drive bias circuit 205 may include an output transistor Q13 having a collector connected to a battery voltage Vbat terminal, a base connected to a connection node of the resistor R11 and the transistor Q11 connected by the diode, and an emitter connected to an output terminal through a resistor R13. The drive bias circuit 205 may further include a capacitor C11 connected to the base of the output transistor Q13. The drive bias circuit 205 illustrated in FIG. 4 is merely illustrated as an example and is not limited thereto.

As an example, the first bias circuit 210 may include a resistor R21, transistors Q21 and Q22 connected to each other by a diode, and a resistor R22, which are connected to each other in series between a first reference current Iref1 terminal and a ground. The first bias circuit 210 may include an output transistor Q23 having a collector connected to a battery voltage Vbat terminal, a base connected to a connection node of the resistor R21 and the transistor Q21 connected by the diode, and an emitter connected to an output terminal through a resistor R23. The first bias circuit 210 may further include a capacitor C21 connected to the base of the output transistor Q23. The first bias circuit 210 illustrated in FIG. 4 is merely illustrated as an example and is not limited thereto.

As an example, the second bias circuit 220 may include a resistor R31, transistors Q31 and Q32 connected to each other by a diode, and a resistor R32, which are connected to each other in series between a second reference current Iref2 terminal and a ground. The second bias circuit 220 may include an output transistor Q33 having a collector connected to a battery voltage Vbat terminal, a base connected to a connection node of the resistor R31 and the transistor Q31 connected by the diode, and an emitter connected to an output terminal through a resistor R33. The second bias circuit 220 may further include a capacitor C31 connected to the base of the output transistor Q33. The second bias circuit 220 illustrated in FIG. 4 is merely illustrated as an example and is not limited thereto.

As an example, in a case in which a value of the resistor R23 of the first bias circuit 210 and a value of the resistor R33 of the second bias circuit 220 are set to be different from each other, the magnitude of the first bias current Ibias1 and the magnitude of the second bias current Ibias2 may be set. The manner of setting the first and second bias currents to be different from each other is not limited to the above-mentioned example.

Figure 5A:
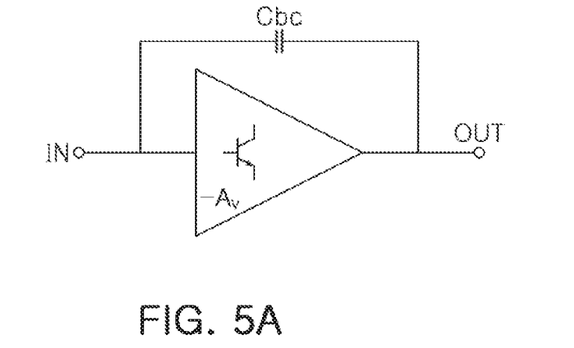
FIGS. 5A and 5B are views describing examples of input capacitance by a mirror capacitance effect of an amplification circuit.
Figure 5B:
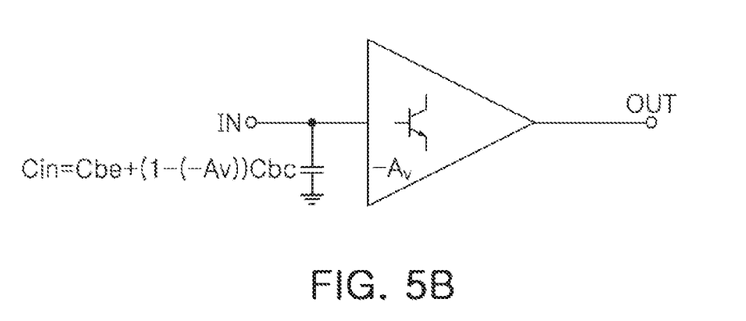

FIGS. 5A and 5B are views describing examples of input capacitance by a mirror capacitance effect of an amplification circuit.

Referring to FIG. 5A, the amplification circuit may include base-collector capacitance Cbc between an input terminal (a base) and an output terminal (a collector).

Referring to FIG. 5B, input capacitance Cin appearing at the base of the input node by a miller capacitance effect may be expressed by Equation 1 below using the base-collector capacitance Cbc.

$$Cin = Cbe + (1-(-Av))*Cbc \qquad \text{Equation 1}$$

Equation 1 indicates that the input capacitance of the amplification circuit may be boosted by a voltage gain (−Av). In addition, the magnitude of the input capacitance may vary based on the voltage gain (−Av) of an inverting amplification circuit. Accordingly, in an example in which the first amplification circuit 110 and the second amplification circuit 120 which have the same size as each other are biased to different levels, since the second amplification circuit 120 to which a bias current of relatively low magnitude is supplied may have transconductance gm lower than that of the first amplification circuit 110 and may thus have a low voltage gain, the second amplification circuit may have a low input capacitance, even if the first amplification circuit 110 and the second amplification circuit 120 have the same size as each other.

In an impedance aspect, if the second amplification circuit 120 is biased to a bias current of a low magnitude in a state in which the amplification circuit is separated into the first amplification circuit 110 and the second amplification circuit 120 which have the same size as each other, the second amplification circuit 120 may have an input impedance greater than an input impedance of the first amplification circuit 110.

In an example, the current of the signal may be concentrated on the first amplification circuit 110, which is a path that has low input impedance, and the magnitude of the fundamental frequency signal and the IM3 component which are output from the second amplification circuit 120 may be smaller than the magnitude of the fundamental frequency signal and the IM3 component of the first amplification circuit 110.

As a result, even if the IM3 components of the first amplification circuit and the second amplification circuit having the same size as each other have a phase difference of exactly 180°, since there is a difference of the magnitudes of the IM3 components, it may be difficult to achieve the maximum IM3 cancellation effect.

In order to compensate for the above-mentioned phenomenon, if the size of the second amplification circuit 120 that is supplied with a bias having a small magnitude is relatively greater than a size of the first amplification circuit 110, the base-collector junction capacitance of the second amplification circuit 120 may be further increased. Accordingly, the input impedance may be decreased and the amplification circuits may be driven with a higher current, such that more effective IM3 cancellation may be achieved.

In addition, in the transistor that has the low bias level, the voltage gain (Av) may be small, but if the size of the transistor is increased, parasitic capacitances cbe and cbc may be increased and the input capacitance Cin may increase, such that the input impedance may be decreased and a current of an input signal may be increased. In an example in which the input current is increased, an IM3 current may be increased in proportion to the third power of the magnitude of the input current by a nonlinear equation. As a result, if an asymmetrical amplification structure is used, the magnitudes of IM3 output from the two amplification circuits 110 and 120 may be compensated to be approximately the same as each other, such that the cancellation effect of IM3 may be improved and linearity may be improved.

Figure 6:
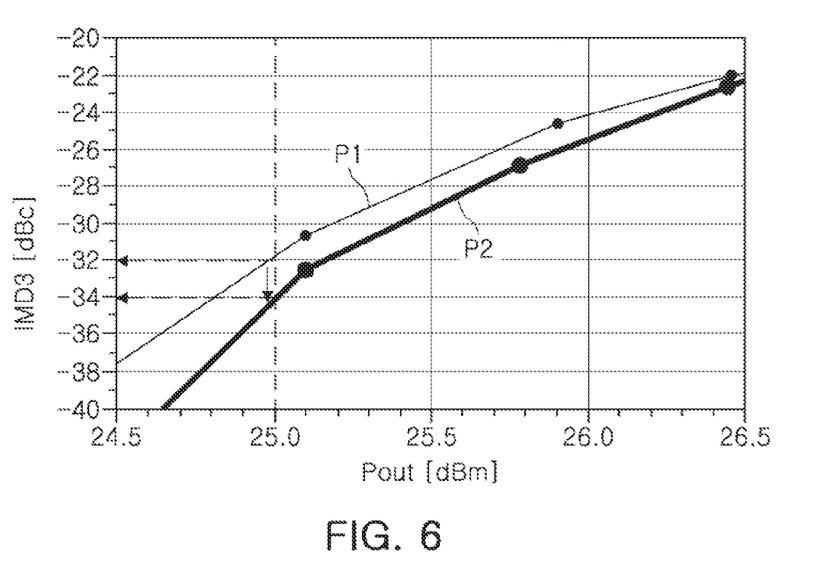
FIG. 6 illustrates an example of a characteristic graph of IMD3-Pout depending on whether or not a variable bias is used.

FIG. 6 is a characteristic graph of IMD3-Pout depending on whether or not a variable bias is used.

P1 and P2 are result graphs of an IMD3 simulation in a frequency band of LTE B3 (@1710 MHz to 1785 MHz), where Q1 is an IMD3-Pout characteristic graph for an example in which first and second amplification circuits (210:1500 μm$^2$, 220:1500 μm$^2$) which have the same size as each other are used, and Q2 is an IMD3-Pout characteristic graph for a case in which first and second amplification circuits (210:1500 μm$^2$, 220:2100 μm$^2$) which have an asymmetric size are used.

Referring to P1 and P2 of FIG. 6, at a target power (Pout) of 25 dBm, P1 is −32 dBc and in the example, P2 is −34 dBc, such that there is an improvement effect of approximately 2 dB.

As set forth above, according to an example, IMD3 and linearity may be further improved by implementing a structure that includes a parallel amplification circuit in an asymmetrical amplification structure while making the magnitudes of a bias current different from each other, in the parallel amplification circuit of a device using a two-tone signal including two different frequency components.

That is, magnitudes of the respective bias currents of parallel amplification circuits may be implemented to be different from each other and the respective sizes of the parallel amplification circuits may be implemented to be different from each other, IM3 currents output from the parallel amplification circuit may have a phase difference of 180° and may have the same magnitude as each other, thereby more efficiently implementing an IM3 cancellation effect.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifying apparatus comprising:
    a first bias circuit configured to generate a first bias current which has a first magnitude;
    a first amplification circuit connected between a first node and a second node, and configured to receive the first bias current, amplify a signal input through the first node, and output a first amplified signal to the second node;
    a second bias circuit configured to generate a second bias current which has a second magnitude that is different from the first magnitude of the first bias current; and
    a second amplification circuit connected in parallel with the first amplification circuit between the first node and the second node, and configured to receive the second bias current, amplify the signal input through the first node, and output a second amplified signal to the second node,
    wherein the second amplification circuit is configured to have a current gain that is different from a current gain of the first amplification circuit,
    wherein the magnitude of the second bias current is less than the magnitude of the first bias current, and
    wherein the current gain of the second amplification circuit is greater than the current gain of the first amplification circuit.

2. The power amplifying apparatus of claim 1, wherein the second amplified signal has a harmonic component having a phase that offsets from an intermodulation distortion (IM3) component in the first amplified signal.

3. The power amplifying apparatus of claim 1, wherein a number of transistors in the second amplification circuit is greater than a number of transistors in the first amplification circuit.

4. The power amplifying apparatus of claim 1, wherein the magnitude of the second bias current is greater than the magnitude of the first bias current.

5. The power amplifying apparatus of claim 4, wherein a number of transistors in the second amplification circuit is smaller than a number of transistors in the first amplification circuit.

6. The power amplifying apparatus of claim 5, wherein the current gain of the second amplification circuit is less than the current gain of the first amplification circuit.

7. The power amplifying apparatus of claim 1, wherein
the first bias current is a bias current of class AB, and
the second bias current is a bias current of deep class AB between class AB and class B.

8. The power amplifying apparatus of claim 1, wherein the second bias circuit is configured to generate the second bias current to have a magnitude that corresponds to a magnitude of a fundamental frequency included in the input signal.

9. A power amplifying apparatus comprising:
a drive bias circuit configured to generate a drive bias current;
a drive amplification circuit connected between an input terminal and a first node, and configured to receive the drive bias current amplify an input signal which has a first frequency component and a second frequency component, and output a first amplified signal;
a first bias circuit configured to generate a first bias current which has a first magnitude;
a first amplification circuit connected between the first node and a second node, and configured to receive the first bias current, amplify a signal input through the first node, and output a second amplified signal to the second node;
a second bias circuit configured to generate a second bias current which has a second magnitude different from the first magnitude of the first bias current; and
a second amplification circuit connected in parallel with the first amplification circuit between the first node and the second node, and configured to receive the second bias current, amplify the signal input through the first node, and output a third amplified signal to the second node,
wherein the second amplification circuit is configured to have a current gain that is different from a current gain of the first amplification circuit,
wherein the magnitude of the second bias current is less than the magnitude of the first bias current, and
wherein the current gain of the second amplification circuit is higher than the current gain of the first amplification circuit.

10. The power amplifying apparatus of claim 9, wherein the third amplified signal has a third-harmonic component having a phase that offsets from a third-order intermodulation distortion (IM3) component in the second amplified signal.

11. The power amplifying apparatus of claim 9, wherein the magnitude of the second bias current is greater than the magnitude of the first bias current.

12. The power amplifying apparatus of claim 11, wherein the current gain of the second amplification circuit is lower than the current gain of the first amplification circuit.

13. The power amplifying apparatus of claim 9, wherein
the first bias current is a bias current of class AB, and
the second bias current is a bias current of deep class AB between class AB and class B.

14. The power amplifying apparatus of claim 9, wherein the second bias circuit is configured to generate the second bias current to have a magnitude that corresponds to a magnitude of a fundamental frequency included in the input signal.

15. A power amplifying apparatus comprising:
a first amplifier configured to have a first current gain, and configured to generate a first amplified signal based on a received first bias current having a first magnitude and an input signal comprising one or more frequency components; and
a second amplifier configured to have a second current gain greater than the first current gain of the first amplifier, connected in parallel with the first amplifier, and configured to generate a second amplified signal based on the input signal and a received second bias current having a second magnitude that is less than the first magnitude of the first bias current,
wherein the second amplified signal has a harmonic component having a phase that offsets from an intermodulation distortion (IM3) component in the first amplified signal.

16. The apparatus of claim 15, wherein a number of transistors implemented by the second amplifier is greater than a number of transistors implemented by the first amplifier.

* * * * *